United States Patent
Zink et al.

(10) Patent No.: US 9,590,094 B2
(45) Date of Patent: Mar. 7, 2017

(54) SEMICONDUCTOR DEVICE WITH POWER TRANSISTOR CELLS AND LATERAL TRANSISTORS AND METHOD OF MANUFACTURING

(71) Applicant: Infineon Technologies AG, Neubiberg (DE)

(72) Inventors: Robert Zink, Riegersdorf (AT); Stefan Decker, Munich (DE); Sven Lanzerstorfer, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/738,245

(22) Filed: Jun. 12, 2015

(65) Prior Publication Data

US 2015/0380543 A1 Dec. 31, 2015

(30) Foreign Application Priority Data

Jun. 26, 2014 (DE) .................. 10 2014 108 963

(51) Int. Cl.
*H01L 29/78* (2006.01)
*H01L 29/66* (2006.01)
(Continued)

(52) U.S. Cl.
CPC ...... *H01L 29/7811* (2013.01); *H01L 21/0217* (2013.01); *H01L 21/0223* (2013.01); *H01L 21/02255* (2013.01); *H01L 21/26513* (2013.01); *H01L 21/76202* (2013.01); *H01L 27/0922* (2013.01); *H01L 29/0653* (2013.01); *H01L 29/0696* (2013.01); *H01L 29/404* (2013.01); *H01L 29/407* (2013.01); *H01L 29/4236* (2013.01); *H01L 29/66568* (2013.01); (Continued)

(58) Field of Classification Search
CPC ............. H01L 29/7811; H01L 29/0922; H01L 29/0653; H01L 29/0696; H01L 29/404; H01L 29/407; H01L 29/4236; H01L 29/66568; H01L 29/66734; H01L 29/78; H01L 29/7813; H01L 21/0217; H01L 21/0223; H01L 21/02255; H01L 21/26513; H01L 21/76202; H01L 27/0922
See application file for complete search history.

(56) References Cited

U.S. PATENT DOCUMENTS

2005/0275025 A1* 12/2005 Lanzerstorfer ..... H01L 21/8234
257/350
2011/0095360 A1 4/2011 Krumrey et al.
(Continued)

FOREIGN PATENT DOCUMENTS

DE 102010042971 A1 4/2011

*Primary Examiner* — Whitney T Moore
(74) *Attorney, Agent, or Firm* — Murphy, Bilak & Homiller, PLLC

(57) ABSTRACT

By thermal oxidation a field oxide layer is formed that lines first and second trenches that extend from a main surface into a semiconductor layer. After the thermal oxidation, field electrodes and trench gate electrodes of power transistor cells are formed in the first and second trenches. A protection cover including a silicon nitride layer is formed that covers a cell area with the first and second trenches. With the protection cover covering the cell area, planar gate electrodes of lateral transistors are formed in a support area of the semiconductor layer.

10 Claims, 12 Drawing Sheets

(51) Int. Cl.
*H01L 21/762* (2006.01)
*H01L 29/06* (2006.01)
*H01L 29/423* (2006.01)
*H01L 21/02* (2006.01)
*H01L 29/40* (2006.01)
*H01L 21/265* (2006.01)
*H01L 27/092* (2006.01)

(52) U.S. Cl.
CPC ........ *H01L 29/66734* (2013.01); *H01L 29/78* (2013.01); *H01L 29/7813* (2013.01)

(56) References Cited

U.S. PATENT DOCUMENTS

2013/0153995 A1* 6/2013 Misawa ................ H01L 29/407
257/330
2013/0320437 A1 12/2013 Ng et al.

\* cited by examiner

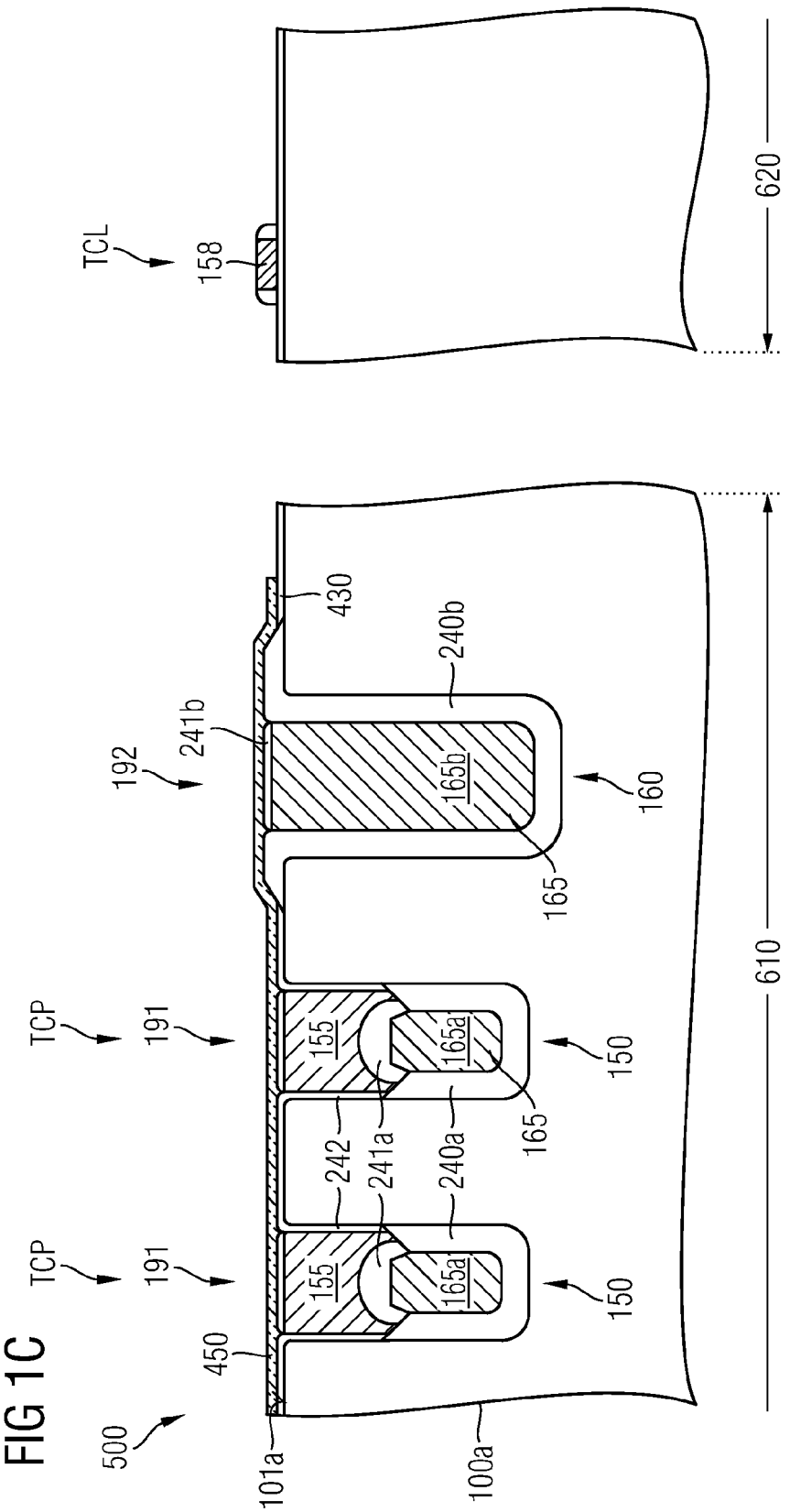

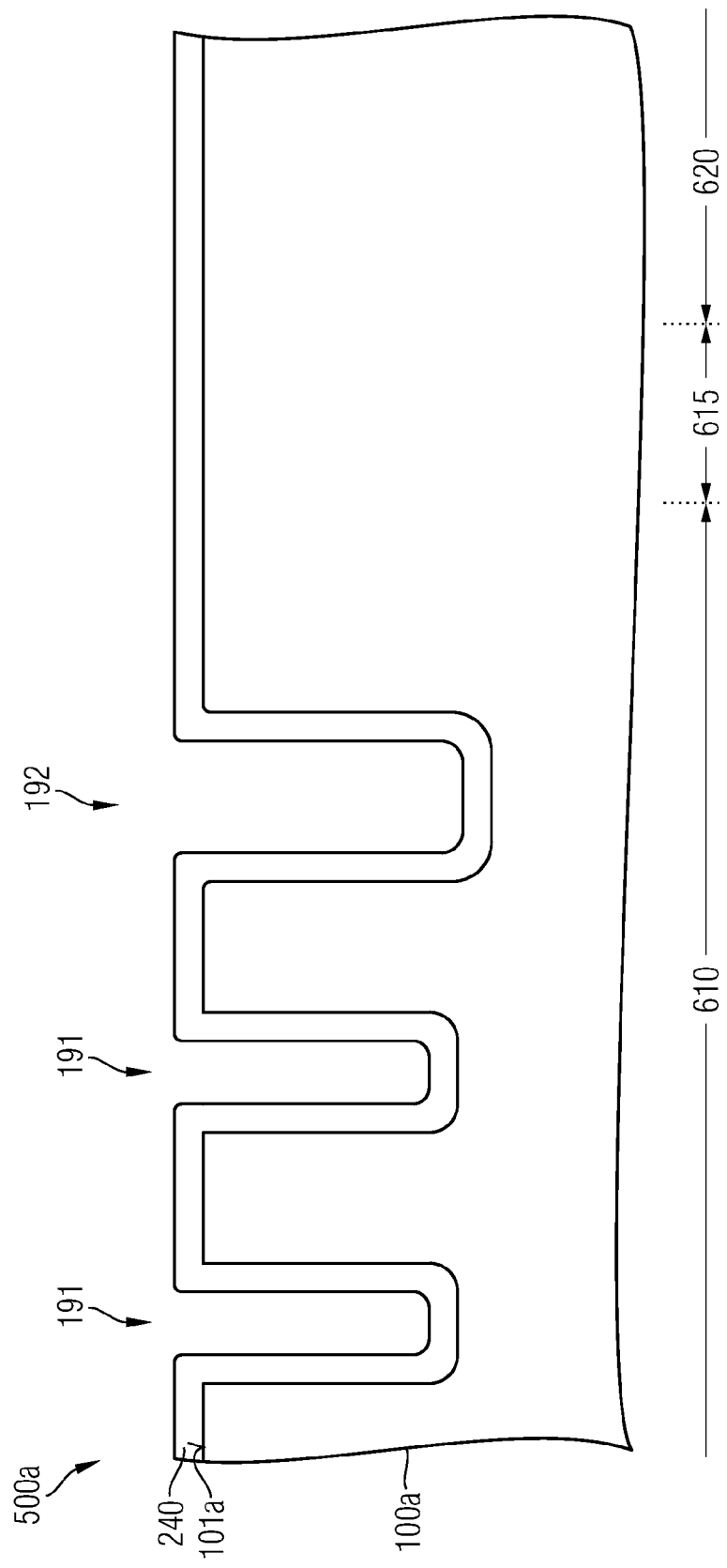

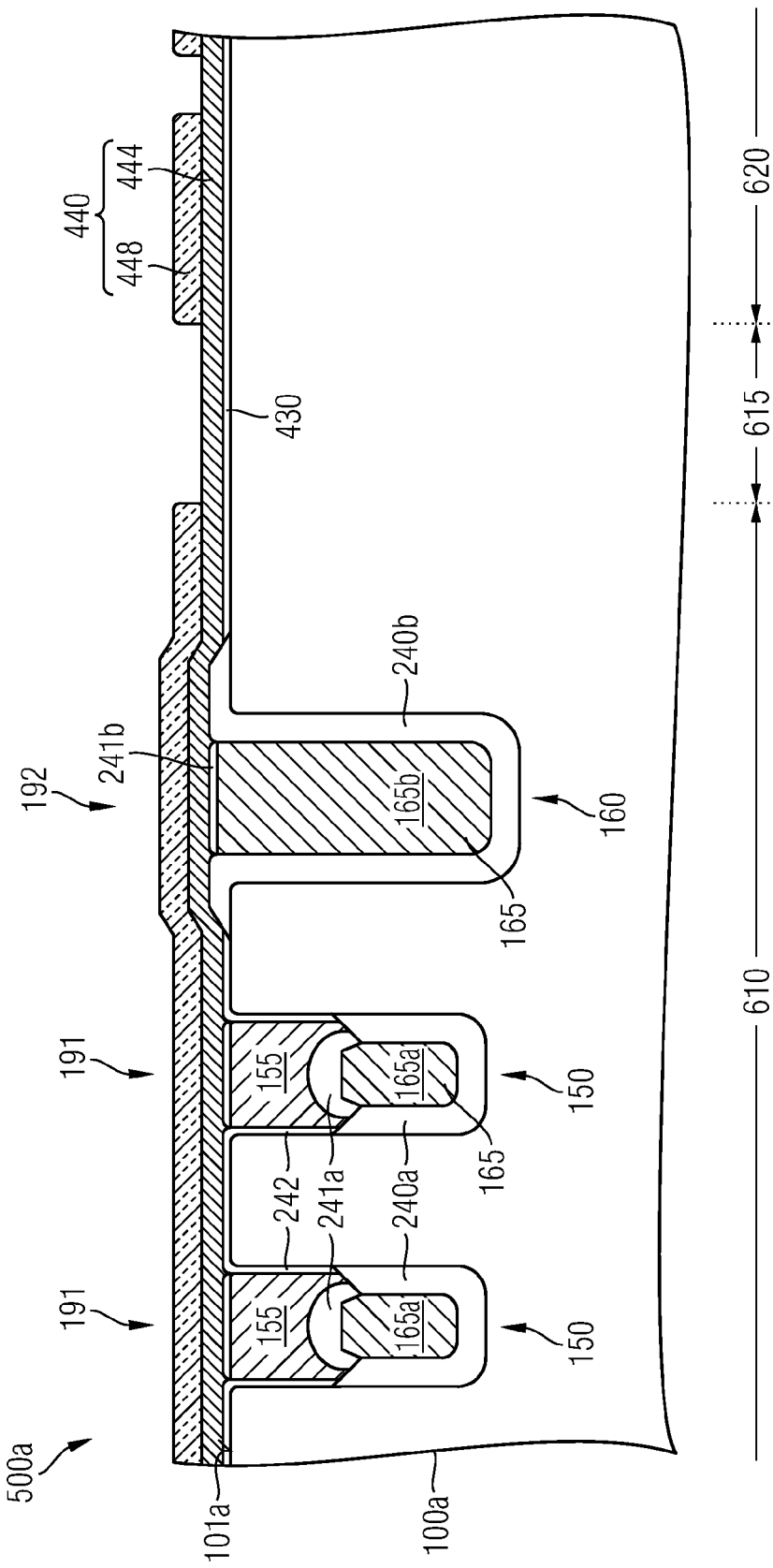

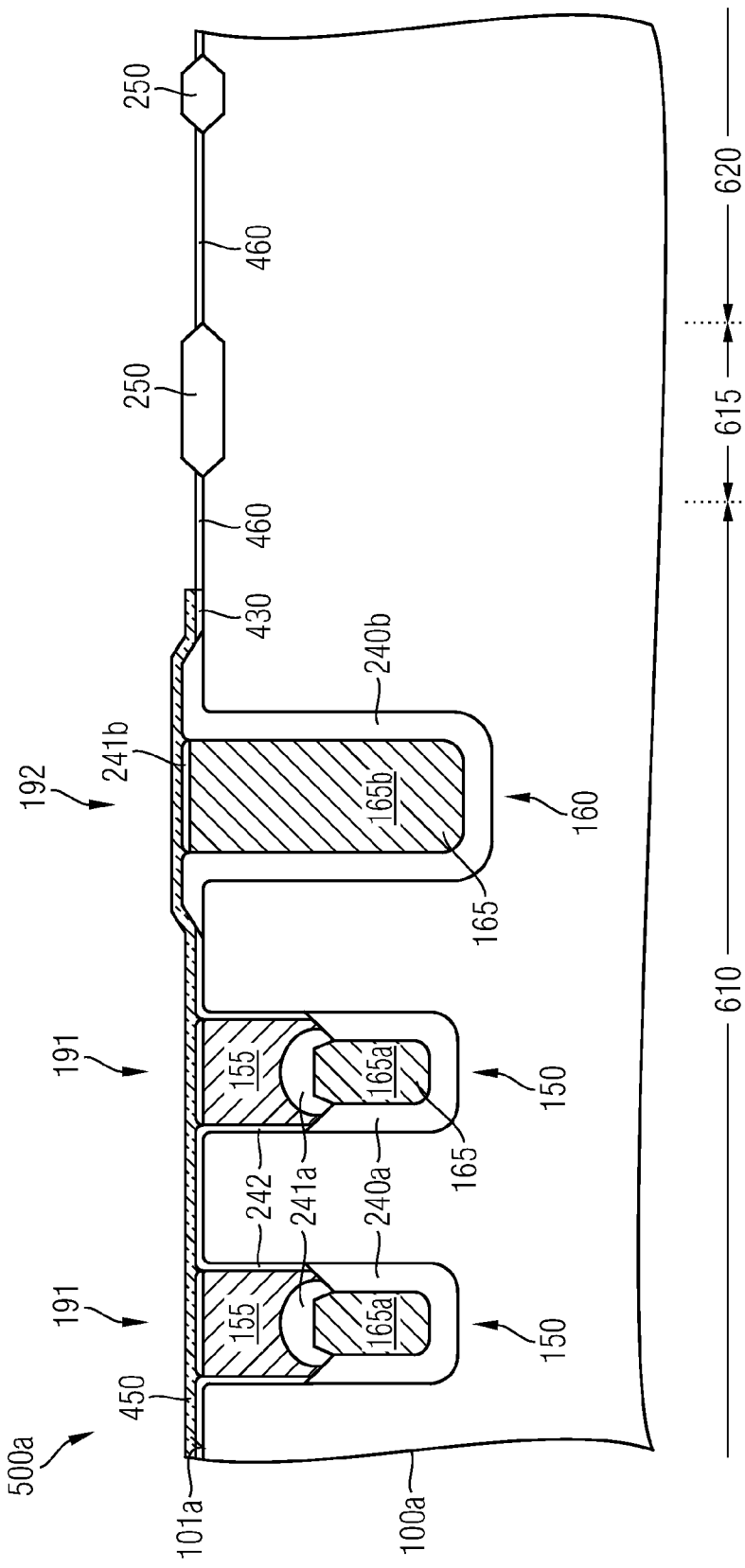

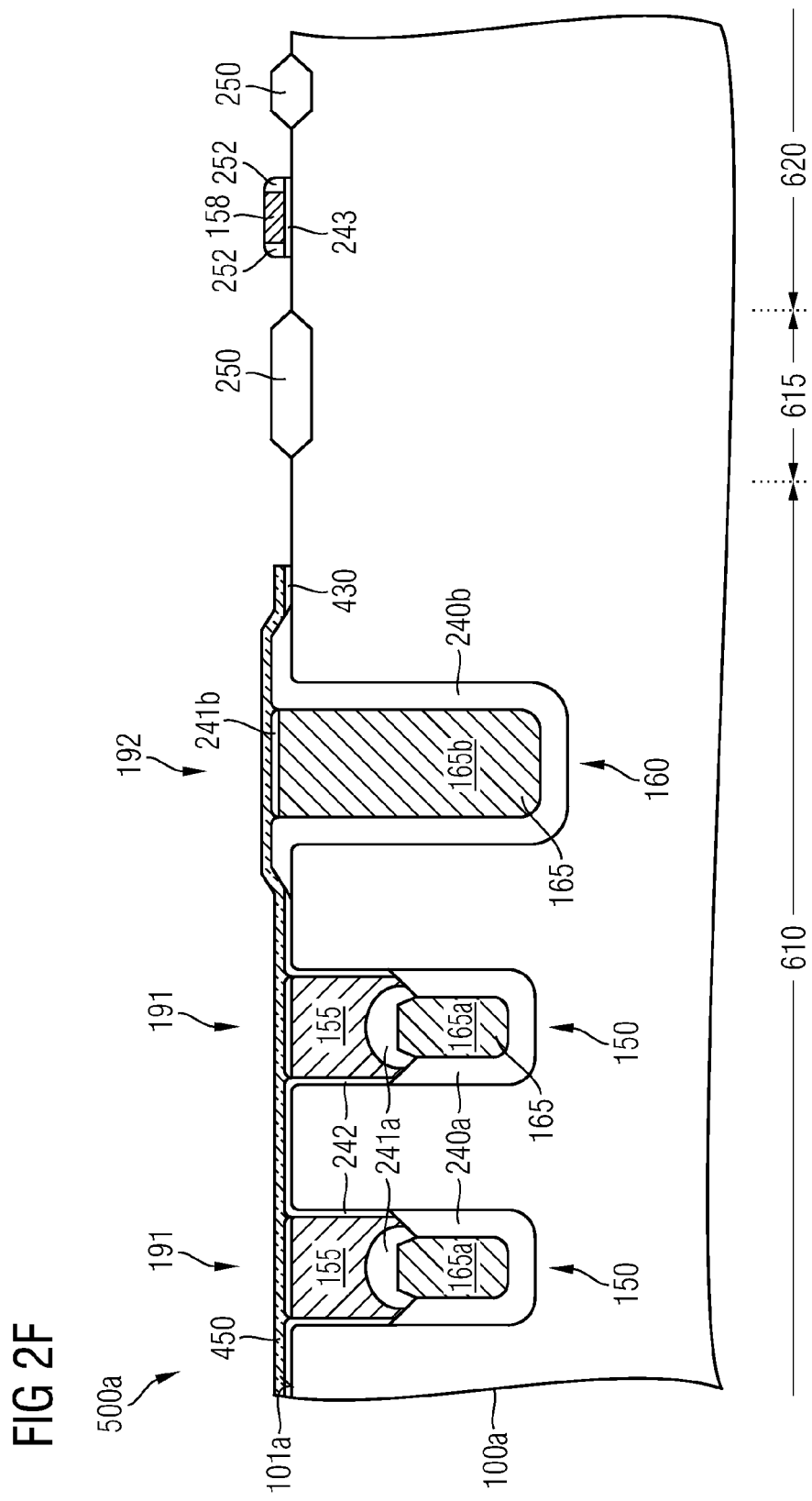

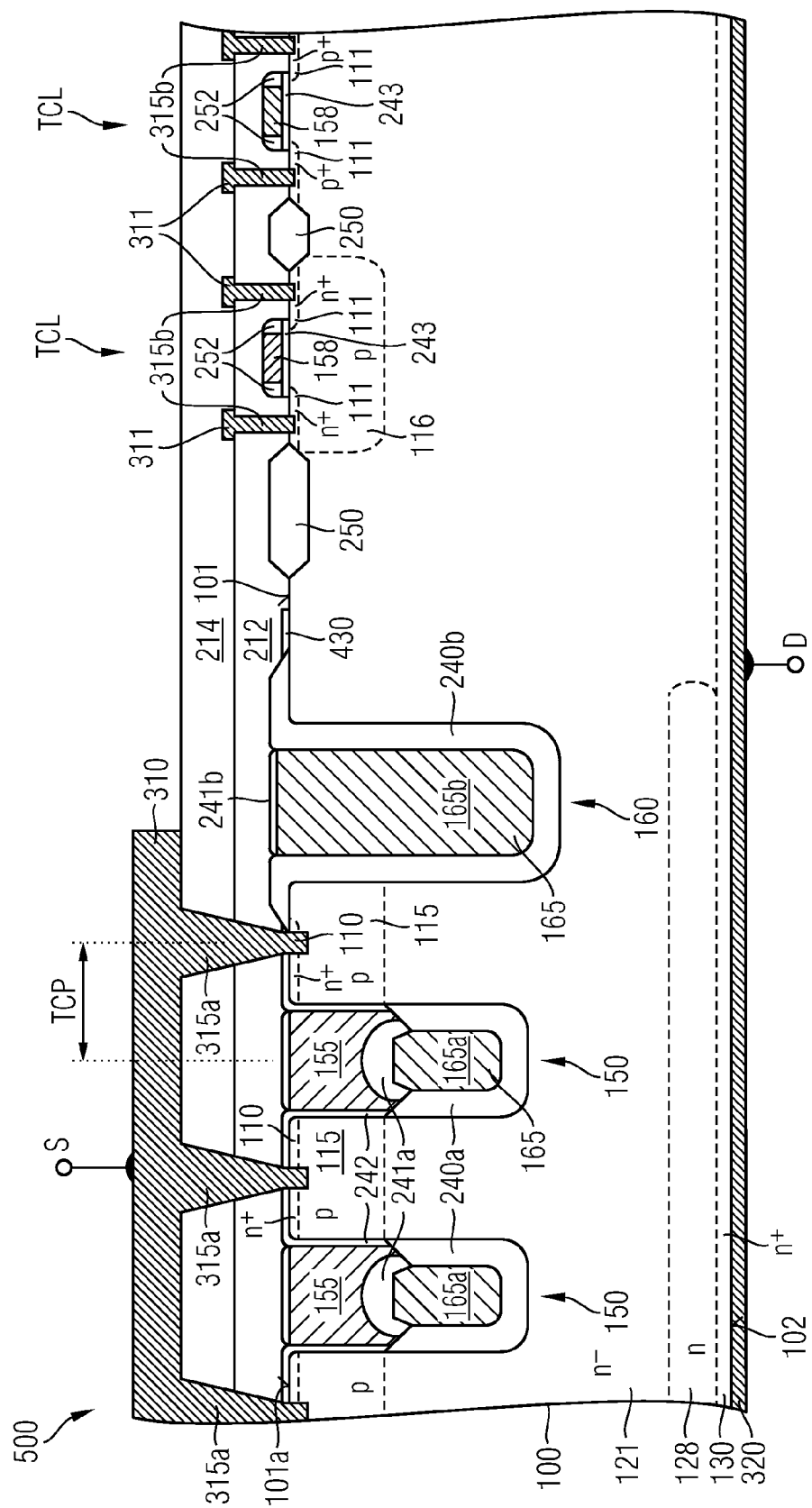

SEMICONDUCTOR DEVICE WITH POWER TRANSISTOR CELLS AND LATERAL TRANSISTORS AND METHOD OF MANUFACTURING

PRIORITY CLAIM

This application claims priority to German Patent Application No. 10 2014 108 963.4 filed on 26 Jun. 2014, the content of said application incorporated herein by reference in its entirety.

BACKGROUND

Smart power devices integrate a microcell power transistor and support circuits, for example control circuits or diagnostic circuits, in the same semiconductor die. The microcell power transistor controls a vertical current flow between a source electrode and a drain electrode placed at opposing sides of the semiconductor die. The support circuits are typically based on lateral low or high voltage transistors in CMOS (complementary metal-oxide-semiconductor) technology.

It is desirable to improve the reliability of semiconductor devices integrating power transistor cells and lateral transistors and to reduce manufacturing costs of such devices.

SUMMARY

According to an embodiment a method of manufacturing a semiconductor device includes forming, by thermal oxidation, a field oxide layer lining first and second trenches that extend from a main surface into a semiconductor layer. After the thermal oxidation, trench gate electrodes and field electrodes of power transistor cells are formed in the first and second trenches. A protection cover is formed that includes a silicon nitride layer and that covers a cell area including the first and second trenches. Planar gate electrodes of lateral transistors are formed in a support area of the semiconductor layer with the protection cover covering the cell area.

According to another embodiment a semiconductor device includes termination trench structures extending from a first surface into a semiconductor body, wherein the termination trench structures include field electrodes. Active trench structures extend from the first surface into the semiconductor body and include field electrodes and gate electrodes between the field electrodes and the first surface, wherein the gate electrodes are electrically insulated from the field electrodes. Source zones of power transistor cells are formed in mesa portions of the semiconductor body between the active trench structures. The semiconductor device further includes lateral transistors that include planar gate electrodes and source/drain zones of the first conductivity type. The source/drain zones of the lateral transistors and the source zones of the power transistor cells have a same vertical extension.

According to a further embodiment an electronic circuit includes a semiconductor device. The semiconductor device includes termination trench structures extending from a first surface into a semiconductor body, wherein the termination trench structures include field electrodes. Active trench structures extend from the first surface into the semiconductor body and include field electrodes and gate electrodes between the field electrodes and the first surface, wherein the gate electrodes are electrically insulated from the field electrodes. Source zones of power transistor cells are formed in mesa portions of the semiconductor body between the active trench structures. The semiconductor device further includes lateral transistors that include planar gate electrodes and source/drain zones of the first conductivity type. The source/drain zones of the lateral transistors and the source zones of the power transistor cells have a same vertical extension.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic cross-sectional view of the semiconductor substrate portion of FIG. 1B after forming planar gate electrodes of lateral transistors.

FIG. 2A is a schematic cross-sectional view of a portion of a semiconductor substrate for illustrating a method of manufacturing a semiconductor device according to an embodiment including insulator structures formed by a LOCOS (local oxidation of semiconductor) process, after forming a field oxide layer.

FIG. 2C is a schematic cross-sectional view of the semiconductor substrate portion of FIG. 2B after forming an oxidation mask for LOCOS formation.

FIG. 2E is a schematic cross-sectional view of the semiconductor substrate portion of FIG. 2D after forming a protection cover.

FIG. 2F is a schematic cross-sectional view of the semiconductor substrate portion of FIG. 2E after forming planar gate electrodes of lateral transistors in a support area.

FIG. 3 is a schematic cross-sectional view of a portion of a semiconductor device in accordance with another embodiment.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "–" or "+" next to the doping type "n" or "p". For example, "n–" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
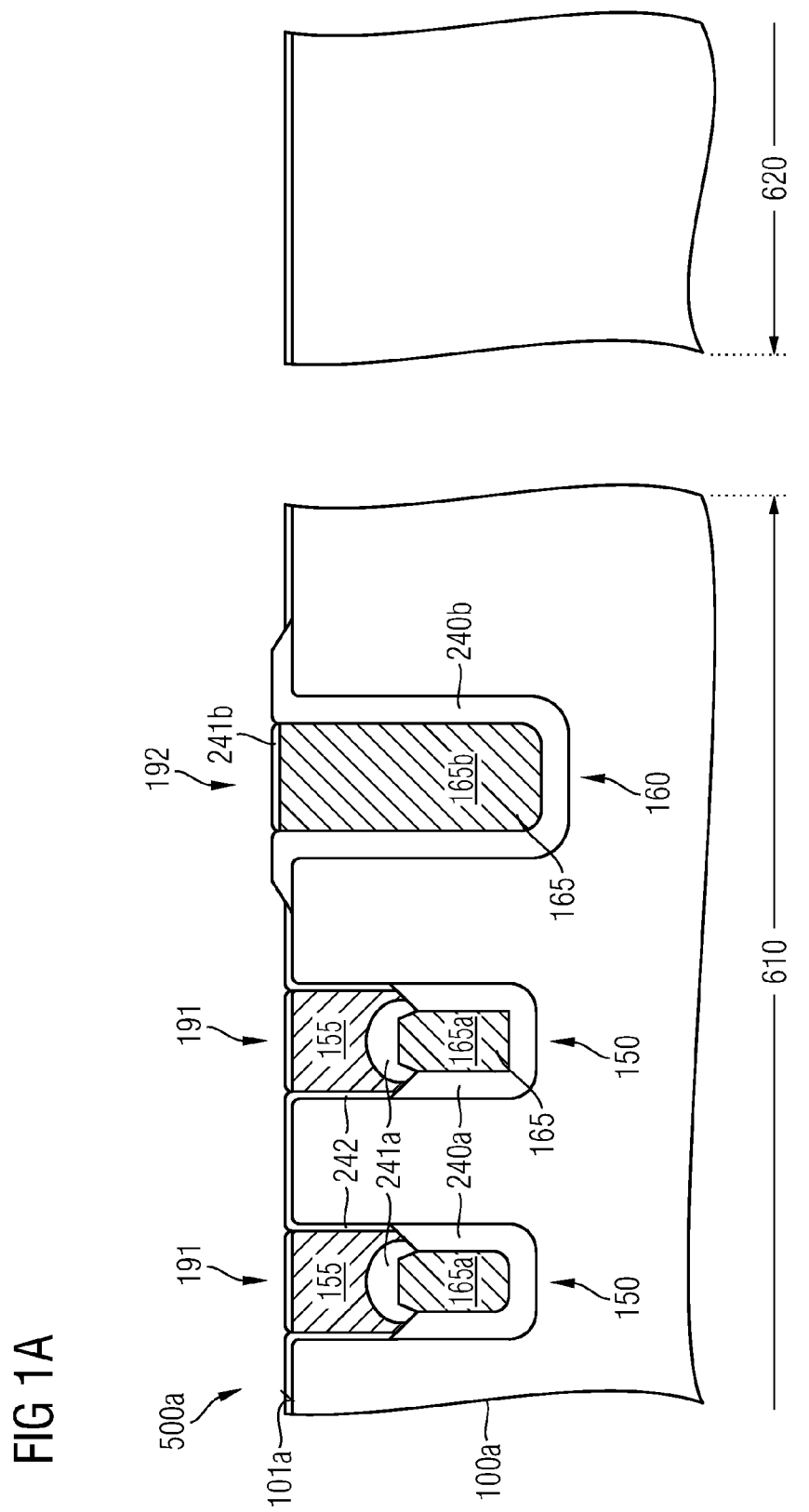
FIG. 1A is a schematic cross-sectional view of a portion of a semiconductor substrate for illustrating a method of manufacturing a semiconductor device according to an embodiment, after forming active and termination trench structures of power transistor cells.

FIG. 1A shows a semiconductor substrate 500a consisting of or including a semiconductor layer 100a of a single-crystalline semiconductor material. The semiconductor substrate 500a may be a semiconductor wafer from which a plurality of identical semiconductor dies can be obtained. The single crystalline semiconductor material of the semiconductor layer 100a may be silicon (Si), silicon carbide (SiC), germanium (Ge), a silicon germanium crystal (SiGe), gallium nitride (GaN), gallium arsenide (GaAs) or any other $A_{III}B_V$ semiconductor, by way of example.

The semiconductor layer 100a may be weakly doped. According to an embodiment, the semiconductor layer 100a is weakly n-conductive. The semiconductor substrate 500a may include further semiconducting or insulating structures such as doped layers, doped columns or buried insulator structures.

A perpendicular to a main surface 101a of the semiconductor layer 100a defines a vertical direction and directions orthogonal to the vertical direction are horizontal directions.

Before applying any photolithography process for patterning structures above the main surface 101a in a support area 620, a first mask layer may be deposited and patterned by photolithography to form a first mask for defining power transistor cells TCP in the cell area 610. Using the first mask as an etch mask, first trenches 191 and second trenches 192 are etched from the main surface 101a into the semiconductor layer 100a.

A vertical extension of the first and second trenches 191, 192 may be in a range from 1 to 10 µm, for example from 3 to 5 µm. A horizontal width of the trenches 191, 192 may be in a range from 0.2 to 2 µm, for example in a range from 0.8 to 1.0 µm. The first and second trenches 191, 192 are stripe-shaped trenches or portions of stripe-shaped trenches extending in a horizontal direction orthogonal to the cross-sectional plane. The first and second trenches 191, 192 may have the same cross-sectional area. According to other embodiments, the second trenches 192 may be wider and deeper than the first trenches 191. For example, a width of the second trenches 192 exceeds a width of the first trenches 191 by at least 5%.

The first and second trenches 191, 192 may form a pattern of regularly spaced stripe-shaped trenches, wherein the outermost stripe-shaped trenches as well as end portions of central stripe-shaped trenches between the outermost stripe-shaped trenches form the second trenches 192 and wherein the central portions of the central stripe-shaped trenches form the first trenches 191.

The semiconductor substrate 500a may be subjected to a thermal treatment in an oxygen containing atmosphere to form a sacrificial oxide on exposed surface portions of the semiconductor layer 100a. An etch process may promptly remove the sacrificial oxide. Forming and recessing the sacrificial oxide both rounds the edges at the openings of the first and second trenches 191, 192, smoothens the sidewalls of the first and second trenches 191, 192 and improves the quality of gate dielectrics and field oxides formed at a later stage in the process.

The semiconductor substrate 500a is subjected to a further thermal treatment at about 1150° C. in oxygen containing ambient, wherein a thick conformal field oxide layer is grown on the semiconductor layer 100a. A first fill material forming field electrodes 165 is deposited on the field oxide layer 240 to completely fill the first and second trenches 191, 192. A polishing process may remove material deposited outside the trenches 191, 192 above the main surface 101a. After the polishing process, the first fill material fills the first and second trenches 191, 192 and is completely removed from outside the first and second trenches 191, 192.

A second mask layer may be deposited and patterned by photolithography to form a second mask that covers a first region of the main surface 101a including the second trenches 192 and that exposes a second region including the first trenches 191. A selective recess of the first fill material in the first trenches 191 uses the second mask as an etch mask. The recess is effective on a flat topology and can be precisely controlled. By contrast, if support circuits including planar gate structures have been formed before recessing the first fill material, the resulting topology in the support area 620 conflicts with a polishing process. As a consequence, a recess of the first fill material is typically deeper to avoid the formation of undesired spacer structures of the first fill material along vertical edges of the planar gate structures. The deeper recess results in larger absolute deviations of the position of the recessed surface from a target position. Instead, according to the embodiments a position of an exposed edge of a recessed first fill portion 165a of the first fill material can be precisely defined with reference to the main surface 101a.

A third mask layer may be deposited and patterned by photolithography to form a third mask. The third mask patterns the field oxide layer in a masked etch process. Exposed portions of the field oxide layer in upper portions of the first trenches 191, which are not shielded by the recessed first fill portion 165a, as well as on portions of the main surface 101a around and between the first trenches 191 are removed.

Then the semiconductor substrate 500a is subjected to a further thermal treatment in oxygen containing atmosphere to form thin gate dielectrics 242 along the sidewalls of the upper portions of the first trenches 191 as well as separation oxides 241a, 241b on the recessed first fill portions 165a and on the unrecessed second fill portions 165b of the first fill material in the second trenches 192. Selectively implanting suitable impurities in the recessed first fill portions 165a may locally increase an oxidation growth rate on the recessed first fill material 165a in the first trenches 191 such that a first separation oxide 241a grown on the recessed first fill portion 165a is thicker than a second separation oxide 241b grown on the unrecessed second fill portion 165b.

A second fill material forming the gate electrodes 155 is deposited to completely fill the upper portions of the first trenches 191. Again, the flat topology above the main surface 101a in the cell area 610 and the support area 620 allows a polishing process that may include a CMP (chemical-mechanical polishing) to remove at least a portion of the second fill material outside the first trenches 191. A shallow recess of the polished second fill material may follow, wherein the shallow recess can precisely define a distance between the gate electrode 155 and the main surface 101a.

FIG. 1A shows a terminal trench structure 160 based on a second trench 192 and including a field electrode 165 and a second field oxide 240b separating the field electrode 165 from the semiconductor layer 100a. Active trench structures 150 based on first trenches 191 include a field electrode in a bottom portion averted from the main surface 101a and a first field oxide 240a separating the field electrode 165 from the semiconductor layer 100a as well as a gate electrode 155 and a gate dielectric 242 electrically insulating the gate electrode 155 against the semiconductor layer 100a. A first separation oxide 241a separates the gate electrode 155 from the field electrode 165 in the active trench structure 150. A second separation oxide 241b may be formed on the field electrode 165 in the termination trench structure 160.

A trench cover layer is deposited and patterned by photolithography to form a protection cover 450 in the cell area 610.

Figure 1B:
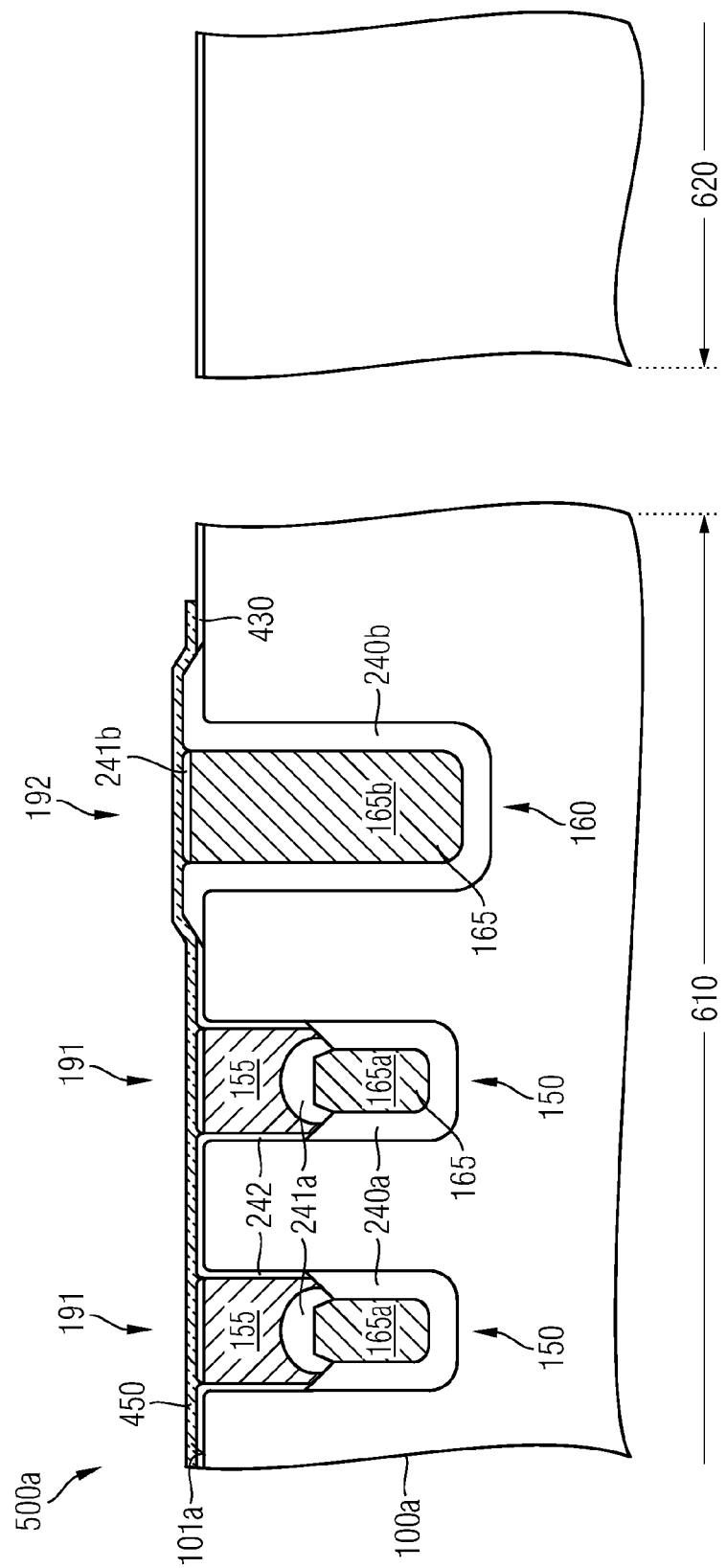
FIG. 1B is a schematic cross-sectional view of the semiconductor substrate portion of FIG. 1A after forming a protection cover that covers the active and termination trench structures.

As shown in FIG. 1B, the protection cover 450 covers the cell area 610 including the active trench structures 150 as well as the termination trench structures 160 and exposes the support area 620.

Then planar gate electrodes 158 of lateral transistors TCL are formed in the support area 620. The protection cover 450 may be removed and after removal of the protection cover 450 dopants may be implanted to form source zones of power transistor cells TCP in the cell area 610 and source/drain zones of the lateral transistors TCL.

FIG. 1C shows active and termination trench structures 150, 160 of power transistor cells TCP in the cell area 610 and a planar gate electrode 158 of a lateral transistor TCL in the support area 620.

FIGS. 2A to 2G refer to an embodiment including the formation of insulator structures based on LOCOS formation. The embodiment can be combined with further details described with reference to FIGS. 1A to 1C.

A first mask may be deposited and patterned by photolithography to form first and second trenches 191, 192 that extend in a cell area 610 from a main surface 101a into a semiconductor layer 100a of a semiconductor substrate 500a. The first and second trenches 191, 192 may form a pattern of equally spaced parallel stripes as described with regard to FIG. 1A. The first and second trenches 191, 192 are formed before any conductive or patterned insulator structure is formed along the main surface 101a outside the cell area 610. Apart from implant processes, formation of the first and second trenches 191, 192 may be the first patterning process using photolithography that is applied to the semiconductor substrate 500a.

After formation of the first and second trenches 191, 192 the semiconductor substrate 500a may be subjected to a thermal treatment in an oxygen containing atmosphere for forming a thin sacrificial oxide which may be promptly removed afterwards. Formation of the sacrificial oxide rounds edges at the openings of the first and second trenches 191, 192 and smooths the sidewalls of the first and second trenches 191, 192.

A further thermal treatment in an oxygen containing ambient forms a conformal field oxide layer 240 that covers the main surface 101a and that lines the first and second trenches 191, 192.

FIG. 2A shows the conformal field oxide layer 240 formed on the main surface 101a in the cell area 610, a support area 620, and a transition area 615 between the cell area 610 and the support area 620. The conformal field oxide layer 240 lines the first and second trenches 191, 192.

A first fill material, for example heavily doped polycrystalline silicon is deposited and completely fills the first and second trenches 191, 192. A polishing process, for example CPM (chemical mechanical polishing) may remove portions of the first fill material deposited outside the first and second trenches 191, 192.

A second mask layer may be deposited and patterned by photolithography to form a second etch mask covering first regions of the main surface 101a including the second trenches 192 and exposing second regions of the main surface 101 including the first trenches 191. The second etch mask may be a photoresist, by way of example. Using the second etch mask, the first fill material is selectively recessed in the first trenches 191, e.g., in a plasma etch process. Recessed first fill portions 165a of the first fill material in the first trenches 191 and unrecessed second fill portions 165b in the second trenches 192 form field electrodes 165.

The second etch mask may be removed and a third mask layer may be deposited and patterned by photolithography to form a third mask exposing regions of the main surface 101a including the first trenches 191 and covering regions of the main surface 101a including the second trenches 192. The third mask may cover at least the first region previously covered by the second mask and may also cover portions of the second region exposed by the second mask. According to other embodiments, the second mask may be used as the third mask or the third mask may be derived from the second mask by amending the second mask, e.g., with lateral spacer structures. The material of the third mask may be a photoresist, by way of example.

Using the third mask as an etch mask, an oxide etch patterns the field oxide layer 240, wherein portions exposed by the third mask are removed.

The third mask may be removed. Gate dielectrics 242 are formed on exposed portions of the semiconductor layer 100a in upper portions of the first trenches 191 and separation oxides 241a, 241b are formed on exposed portions of the field electrodes 165.

According to an embodiment the gate dielectrics 242 and separation oxides 241a, 241b are contemporaneously formed by thermal oxidation during a thermal treatment of the semiconductor substrate 500a in an oxygen containing ambient.

A second fill material is deposited to completely fill the upper portions of the first trenches 191. A polishing process removes portions of the second fill material deposited outside the first trenches 191. The second fill material forms gate electrodes 155 in the first trenches 191. According to an embodiment, a shallow recess, for example through a plasma etch process, of the second fill material may precisely define a distance of an upper edge of the gate electrodes 155 to the main surface 101a. Portions of the gate dielectric formed on the main surface 101a may be replaced with or transformed into a dielectric auxiliary layer 430.

Figure 2B:
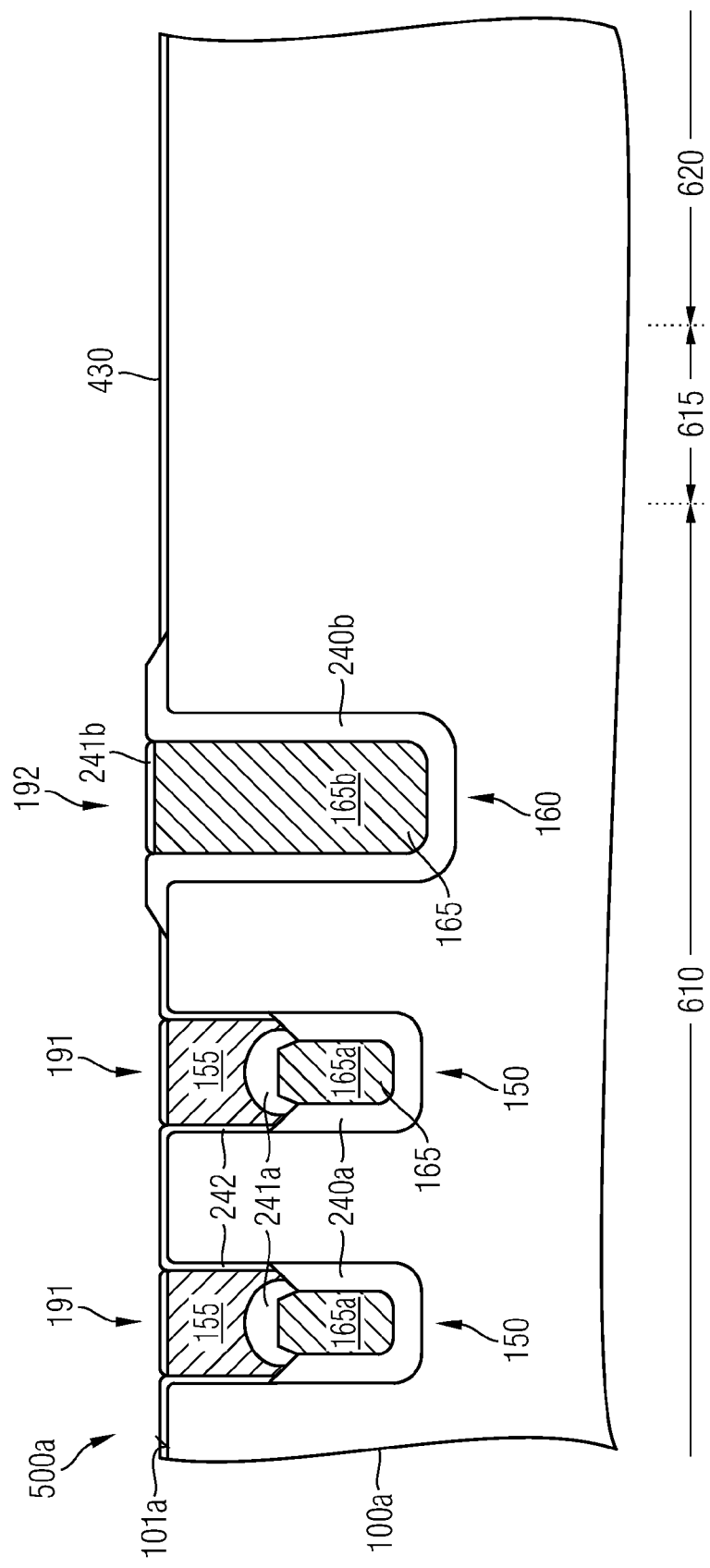
FIG. 2B is a cross-sectional view of the semiconductor substrate portion of FIG. 2A after forming active and termination trench structures of power transistor cells in a cell area.

FIG. 2B shows active trench structures 150 based on the first trenches 191 and termination trench structures 160 based on the second trenches 192.

The first fill material forms field electrodes 165 in the second trenches 192 and in bottom portions of the first trenches 191. First and second field oxides 240a, 240b insulate the field electrodes 165 from the surrounding semiconductor material of the semiconductor layer 100a.

The second fill material forms gate electrodes 155, wherein gate dielectrics 242 separate the gate electrodes 155 from the semiconductor material of the semiconductor layer 100a. In the active trench structures 150 a first separation oxide 241a separates the gate electrode 155 from the field electrode 165. The formation and removal of the sacrificial oxide smooths the interface to the semiconductor layer 100a and reduces defect density in the first and second field oxides 240a, 240b as well as in the gate dielectrics 242.

The auxiliary layer 430 may be a semiconductor oxide, e.g., silicon oxide or thermal silicon oxide layer with a thickness in a range from 5 nm to 60 nm, for example in a range from 15 nm to 20 nm.

Further layers of an oxidation mask 440 may be deposited and patterned by photolithography. The oxidation mask 440 includes a nitride layer 448 with a thickness of at least 100 nm, e.g. about 250 nm. The oxidation mask 440 may further include a buffer layer 444, e.g. an amorphous silicon layer. The buffer layer 444 may reduce thermo-mechanical strain between the nitride layer 448 and the auxiliary layer 430 and/or may supply silicon during the following oxidation process.

A further photolithography process forms openings in the oxidation mask 440, e.g., in the transition area 615 between the cell area 610 and the support area 620 and/or between areas assigned to lateral transistors in the support area 620. The openings extend at least through the nitride layer 448 and may also extend through the buffer layer 444.

FIG. 2C shows the oxidation mask 440 covering the cell area 610 and portions of the support area 620 and exposing portions of the transition and support areas 615. The oxidation mask 440 includes a nitride layer 440 and may include an amorphous silicon layer 422 as well as the auxiliary layer 430.

Figure 2D:
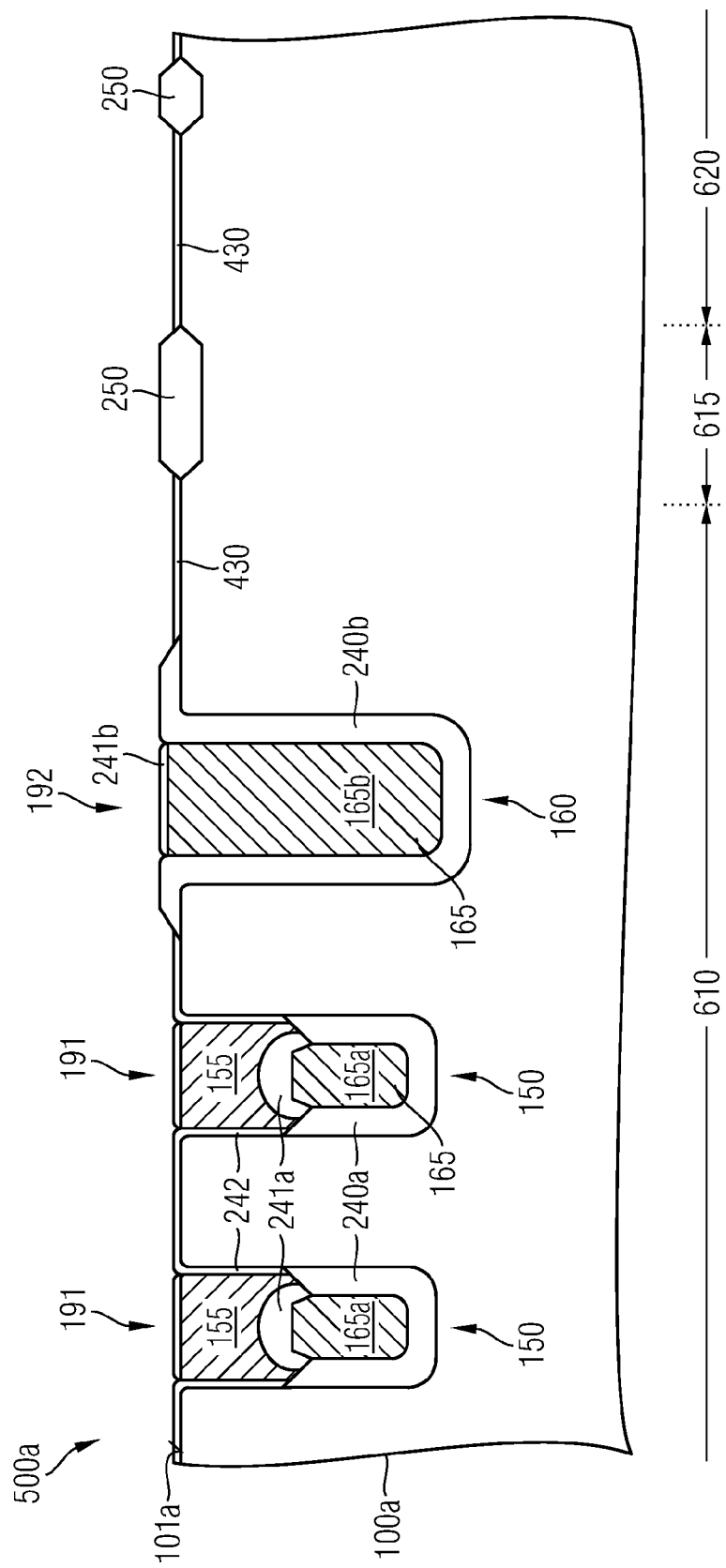
FIG. 2D is a schematic cross-sectional view of the semiconductor substrate portion of FIG. 2C after LOCOS formation.

The semiconductor substrate 500a is subjected to a further thermal treatment in oxygen containing ambient and one or more insulator structures 250 are formed in a LOCOS process in the openings of the oxidation mask 440 as illustrated in FIG. 2D.

A trench cover layer is deposited and patterned by photolithography such that a protection cover 450 covers the active and termination trench structures 150, 160 in the cell area 610 and exposes the support area 620. The protection cover 450 may expose or may cover portions of the auxiliary layer 430 in the transition area 615. The auxiliary layer 430 may be used as etch stop during removal of portions of the trench cover layer and may be transformed or replaced with an auxiliary oxide layer 460, which is a semiconductor oxide, e.g., a silicon oxide layer, by an oxidation process in portions exposed by the protection cover 450 after removal of a photoresist layer used for patterning the trench cover layer.

FIG. 2E shows the protection cover 450, which may be a nitride structure having a thickness of at least 20 nm, for example about 30 nm. The auxiliary oxide layer 460 is formed in areas not covered by the protection cover 450.

An etch process removes the auxiliary oxide layer 460 and a planar gate dielectric 243 for the lateral transistors is formed, which may be lateral low-voltage or lateral high-voltage transistors cells, for example CMOS transistors. In the lateral transistors a current flows parallel to the main surface 101a, respectively. According to an embodiment, the gate dielectric 243 for the lateral transistors consists of or contains a deposited dielectric layer. According to other embodiments, the gate dielectric 243 for the lateral transistors may be a thermally grown oxide layer.

Forming and removing the auxiliary oxide layer 460 removes impurities in the semiconductor layer 100a introduced into the support area 620 by the LOCOS process and may, e.g., suppress the white ribbon effect caused by ammonia outgassing from the nitride layer 448 and forming silicon nitride along the siliconoxide-silicon interface.

A conductive material may be deposited and patterned by photolithography to form planar gate electrodes 158 on portions of the gate dielectric 243 of the lateral transistors. The patterned conductive material may be oxidized. A conformal layer or layer stack of dielectric material, e.g., silicon oxide based on TEOS (tetraethyl orthosilicate), may be deposited and anisotropically etched, such that dielectric spacers 252 are formed along vertical sidewalls of the planar gate electrodes 158. The spacer etch typically stops at the main surface 101a and may remove portions of the gate dielectric 243 outside the planar gate electrodes 158 and dielectric spacers 252.

FIG. 2F shows the planar gate electrodes 158 in the support area 620. The material of the planar gate electrodes 158 may be or may contain heavily doped polycrystalline silicon. Dielectric spacers 252 are formed along the vertical sidewalls of the planar gate electrodes 158. The material of the dielectric spacers may be TEOS silicon oxide.

The protection cover 450 may be removed using an etch process on the basis of phosphoric acid $H_3PO_4$. Then a further conformal dielectric layer 470, e.g. a TEOS layer, may be formed that is effective as a stray oxide for improving the following implants of dopants for the formation of doped regions.

P-type dopants may be implanted to form body zones 115 of the power transistors cells TCP in the cell area 610 and p conductive wells 116 for lateral n-FETs TCLn in the support area 620. N-type dopants may be implanted to form source zones 110 of the power transistors cells TCP in the cell area 610 and source/drain zones 111 of the lateral n-FETs TCLn in the support area 620.

Figure 2G:
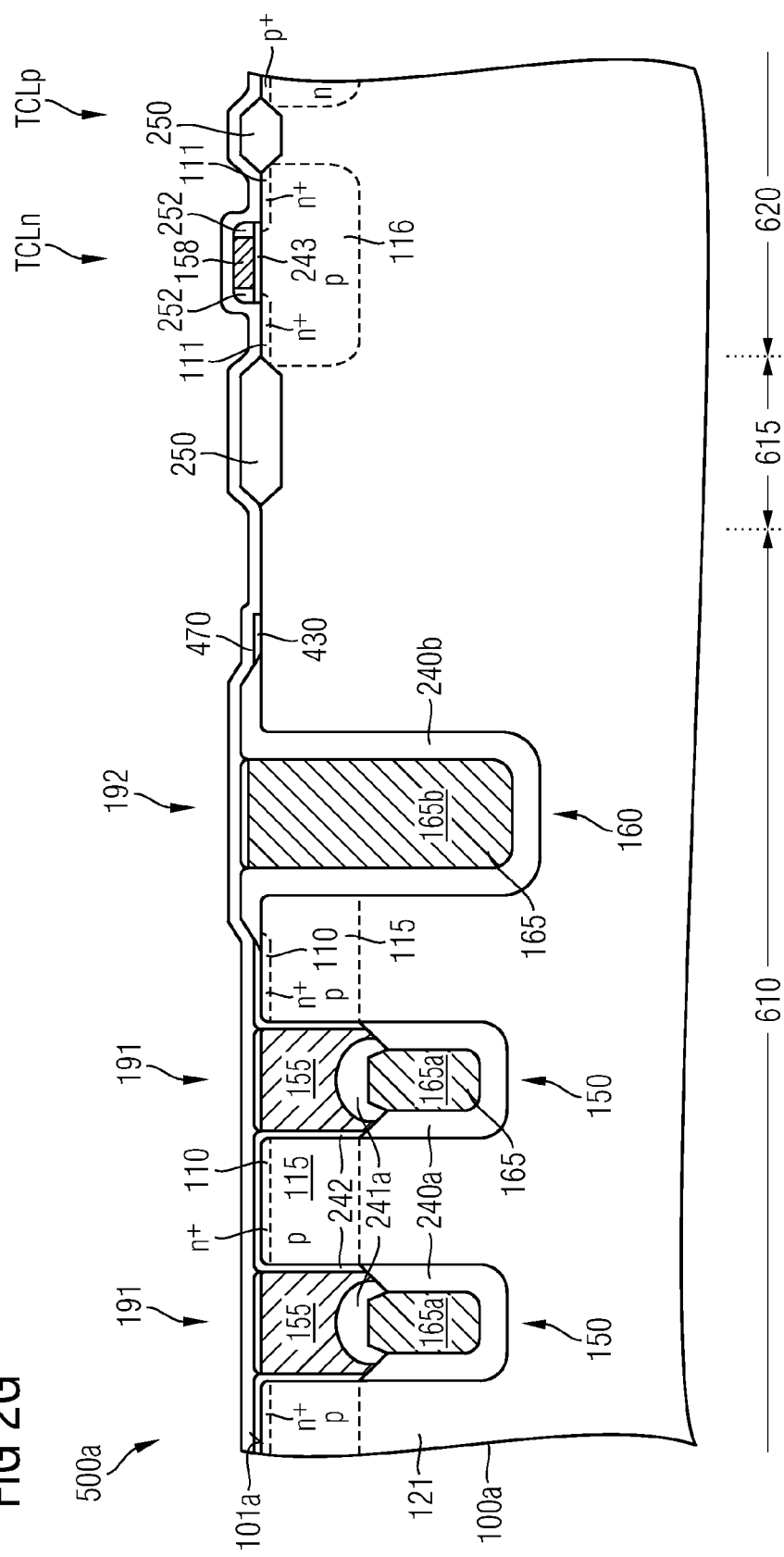
FIG. 2G is a schematic cross-sectional view of the semiconductor substrate portion of FIG. 2F after forming source zones of power transistor cells and source/drain zones of lateral transistors.

FIG. 2G shows the p-conductive body zones 115 formed in mesa portions of the semiconductor layer 100a between the active and termination trench structures 150, 160. Pn junctions are formed between the body zones 115 and a drift zone 121 formed by a directly adjoining weakly n-conductive portion of the semiconductor layer 100a. Since the distance between the gate-to-field electrode transition in the active trench structures 150 and the main surface 101a can be precisely defined as described above, an overlap between the gate electrode 155 and the drift zone 121 can be reduced without increasing the risk that an inversion channel formed in the body zones 115 in an on-state is without connection to the drift zone 121.

FIG. 2G further shows n-conductive source zones 110 forming pn junctions with the body zones 115 in the cell area 610 as well as n-conductive source/drain zones 111 in the support area 620. Since the gate electrodes 155 are not recessed at all with respect to the main surface 101a or, otherwise, very precisely recessed, the source zones 110 may result from comparatively shallow implants as used also for n-type lateral transistors TCLn based on CMOS technology at the 350 nm node. The source/drain zones 111 may have the same vertical extension as the source zones 110 and may be formed in the same implant process.

FIG. 3 refers to a semiconductor device 500 including transistor cells TC and manufactured by the method as described with regard to the previous Figures.

The semiconductor device 500 may be a smart device including power transistor cells TCP of an IGFET (insulated gate field effect transistor), for example a MOSFET (metal oxide semiconductor FET) in the usual meaning including FETs with metal gates as well as FETs with non-metal gates, by way of example. Another embodiment may refer to an IGBT (insulated gate bipolar transistor). The semiconductor device 500 integrates a signal processing circuit, e.g., a logic circuit, driver circuit, sensor circuit and/or control circuit in a support area 620 separated from a cell area 610 that includes the power transistor cells TCP. The semiconductor device 500 may integrate transistors in DMOS (diffusion metal oxide semiconductor) technology and CMOS (complementary metal-oxide semiconductor) technology and may be a smart FET, e.g. a smart low-side or high-side switch or a smart power IC (integrated circuit), e.g. a multi-channel switch or a CAN (controller area network) transceiver.

The semiconductor device 500 is based on a semiconductor body 100 from a single-crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a mainly planar second surface 102 parallel to the first surface 101. A distance between the first and second surfaces 101, 102 is selected to achieve a specified voltage blocking capability of the power transistor cells TCP and may be at least 40 µm, by way of example. In a plane perpendicular to the cross-sectional plane, the semiconductor body 100 may have a rectangular shape with an edge length in the range of several millimeters.

The semiconductor body 100 includes a drift region 121 of a first conductivity type as well as a drain layer 130 of the first conductivity type between the drift region 121 and the second surface 102.

A dopant concentration in the drift region 121 may gradually or in steps increase or decrease with increasing distance to the first surface 101 at least in portions of its vertical extension. According to other embodiments, the dopant concentration in the drift region 121 may be approximately uniform. A mean dopant concentration in the drift region 121 may be between 5E12 cm$^{-3}$ and 1E15 cm$^{-3}$, for example in a range from 5E13 cm$^{-3}$ to 5E14 cm$^{-3}$. The drift region 121 may include further doped zones of the first and/or second conductivity type.

A dopant concentration in the drain layer 130 along the second surface 102 is sufficiently high to form an ohmic contact with a metal directly adjoining the second surface 102. In case the semiconductor body 100 is based on silicon Si, along the second surface 102 a dopant concentration in an n-conductive drain layer 130 may be at least 1E18 cm$^{-3}$, for example at least 5E19 cm$^{-3}$ and in a p-conductive drain layer 130, at least 1E16 cm$^{-3}$, for example at least 5E17 cm$^{-3}$.

A field stop layer 128 of the first conductivity type may separate the drift region 121 from the drain layer 130, wherein a mean dopant concentration in the field stop layer 128 may be at least five times as high as a mean impurity concentration in the drift region 121 and at most one-fifth of a maximum impurity concentration in the drain layer 130.

Termination trench structures 160 and active trench structures 150 extend from the first surface 101 into the semiconductor body 100 in the cell area 610. The active trench structures 150 include gate electrodes 155 in top portions oriented to the first surface 101 and field electrodes 165 in bottom portions oriented to the second surface 102. The termination trench structures 160 include field electrodes 165 but do not contain gate electrodes 155. Thick field dielectrics 240a, 240b separate the field electrodes 165 from the surrounding semiconductor material of the semiconductor body 100. A thin gate dielectric 242 separates the gate electrodes 155 from the semiconductor material of the semiconductor body 100.

A thick separation oxide 241a separates the gate electrodes 155 from the field electrodes 165. A thin separation oxide 241b from the same material as the thick separation oxide 241a may be formed on a surface of the field electrodes 165 in the termination trench structures 160. The separation oxides 241a, 241b are silicon oxides thermally grown on a polycrystalline substrate. A vertical extension of the thick separation oxide 241a exceeds at least twice the vertical extension of the thin separation oxide 241b. According to an embodiment, the maximum vertical extension of the thick separation oxide 241a is at least five times as large as the vertical extension of the thin separation oxide 241b.

The field dielectrics 240a, 240b may be conformal layers of grown semiconductor oxide, for example grown silicon oxide in case the semiconductor body 100 is made from single crystalline silicon. According to other embodiments, the field dielectrics 240a, 240b may include a silicon nitride layer or a silicon oxide resulting from a deposition process.

The gate dielectric 242 is thermally grown semiconductor oxide, for example thermally grown silicon oxide. The separation oxides 241a, 241b are semiconductor oxide layers thermally grown on the material of the field electrodes 165. Gate and field electrodes 155, 165 consist of or contain heavily doped polycrystalline silicon.

In mesa portions of the semiconductor body 100 between the active trench structures 150 and the termination trench structures 160, doped source zones 110 of the first conductivity type may directly adjoin the first surface 101. Body zones 115 of the second conductivity type form first pn-junctions with the source zones 110 and second pn-junctions with the drift region 121. The body zones 115 separate the source zones 110 from the drift region 121. Outside the semiconductor body 100, an interlayer dielectric 212, 214 separates the gate electrodes 155 from a first load electrode 310. The interlayer dielectric 212, 214 may include one or more dielectric layers from silicon oxide, silicon nitride, silicon oxynitride, doped or undoped silicon glass, for example BSG (boron silicate glass), PSG (phosphorus silicate glass) or BPSG (boron phosphorus silicate glass), by way of example.

The interlayer dielectric 212, 214 is a homogeneous or layered conformal structure with uniform cross-section above the active trench structures 150 and above the termination trench structures 160.

The first load electrode 310 may form or may be electrically coupled or connected to a first load terminal, for example the source terminal S in case the power transistor cells TCP form an n-channel IGFET. First contact structures 315a extend through the interlayer dielectric 212, 214 and electrically connect the first load electrode 310 with the body zones 115 and the source zones 110.

A second load electrode 320, which directly adjoins the second surface 102 and the drain layer 130, may form or may be electrically connected to a second load terminal, which may be the drain terminal D in case the power transistor cells TCP form an n-channel IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

In the support area 620 the semiconductor device 500 may include a signal processing circuit, for example a logic circuit, a sense circuit, a control circuit, or a driver circuit such as a gate driver circuit. The signal processing circuit may include lateral transistors TCL with planar gate electrodes 158 and shallow source/drain zones 111, which may be formed contemporaneously with the source zones 110 in the cell area 610, whereby the source zones 110 and the source/drain zones 111 may have the same vertical extension. The support area 620 may further include high voltage transistors including further portions of the field dielectric used for decoupling low-doped lateral drain extensions. Second contact structures 315 extend at least through a portion of the interlayer dielectric 212, 214 and may connect the source/drain zones and the planar gate electrodes 158 with connection lines 311 in a wiring plane. Insulator structures 250, e.g., LOCOS structures may separate neighboring lateral transistor cells TCL.

The source zones 110 of the power transistor cells TCP have the same vertical extension as the source/drain zones 111 of the lateral transistors TCL. According to an embodiment, the vertical extension of the source zones 110 and the source/drain zones 111 is at most 400 nm, for example at most 200 nm. The gate dielectrics 242 and field oxides 240a, 240b, of the power transistor cells TCP are grown on smoothened portions of the semiconductor body 100. An overlap between the gate electrode 155 and the drift region 121 is at most 5000 nm, e.g., at most 1300 nm. The first conductivity type may be n-type as illustrated in the Figures. According to other embodiments, the first conductivity type may be p-type.

Figure 4A:
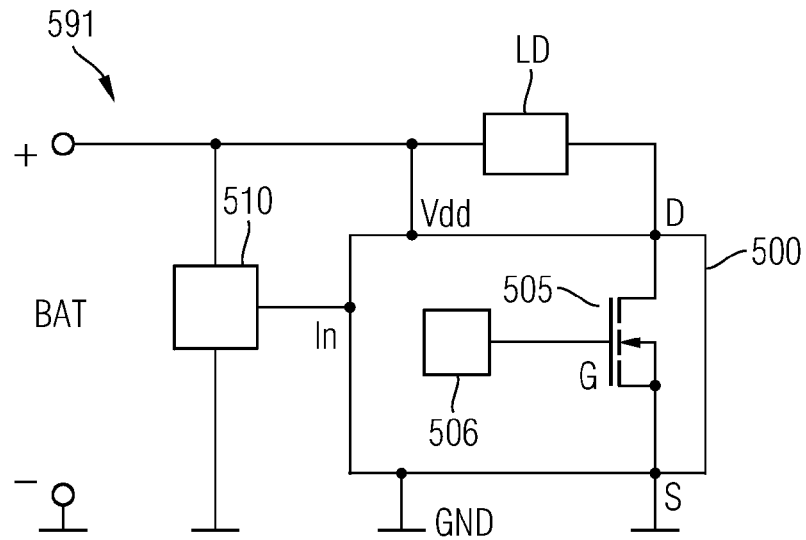
FIG. 4A is a schematic circuit diagram of an electronic circuit including a smart FET (field effect transistor) according to an embodiment.

FIG. 4A refers to an electronic circuit 591 including a semiconductor device 500 as described in the previous figures. The semiconductor device 500 may be a smart FET usable as a low-side switch and including a power FET 505 and a signal processing circuit 506. A drain terminal D is electrically connected to a drain electrode of the power FET 505 and may be connected to a load LD which may be a motor winding, a coil or a transformer winding, by way of example. The load LD is electrically arranged in series between the anode of a battery BAT and the drain terminal D. A source terminal S of the semiconductor device 500 is electrically connected to a source electrode of the power FET 505 and may be connected to a cathode of the battery BAT. Further power terminals Vdd, Gnd may provide the supply voltage for the internal signal processing circuit 506. A gate control circuit 510 may be electrically connected to an input terminal IN and may supply a signal for controlling the switching cycle of the semiconductor device 500.

The power FET 505 includes a microcell power transistor in a DMOS portion of the semiconductor device 500. The signal processing circuit 506 includes transistors of another technology, e.g., CMOS transistors, low-voltage FETs, lateral high-voltage FETs and/or bipolar transistors in a further portion, e.g., a CMOS portion. The signal processing circuit 506 may provide overvoltage protection, ESD protection, current limitation, overload protection and/or short-circuit protection, by way of example. Other embodiments refer to smart high-side switches.

Figure 4B:
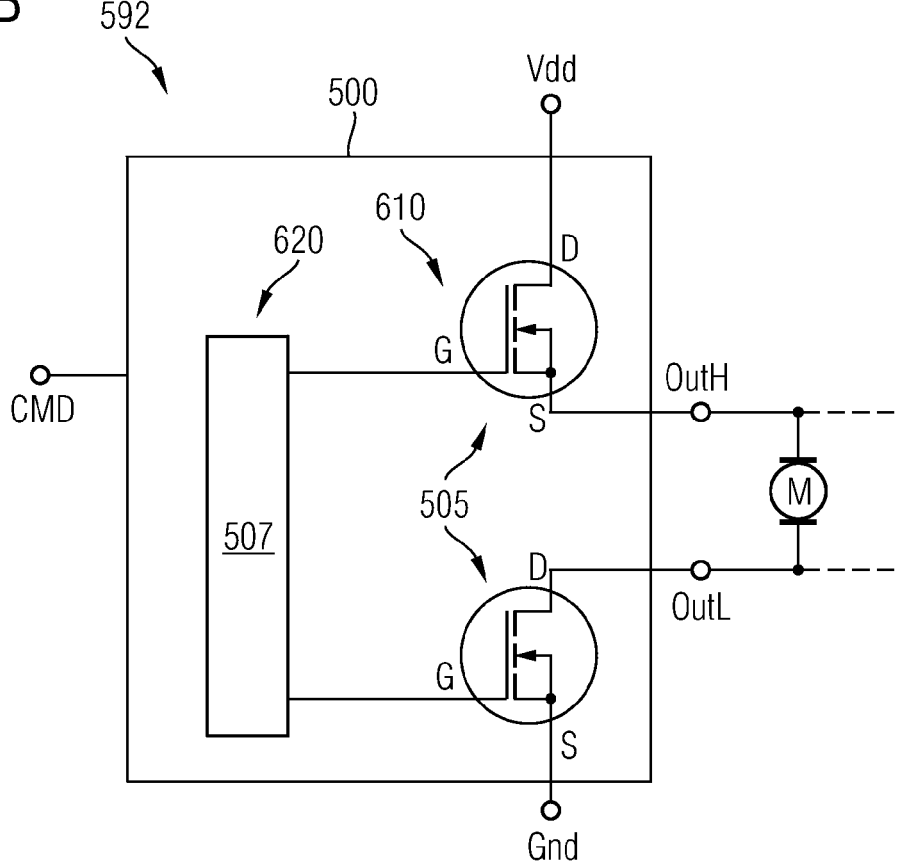
FIG. 4B is a schematic circuit diagram of an electronic circuit including a half-bridge circuit according to a further embodiment.

In the electronic circuit 592 of FIG. 4B the semiconductor device 500 is a monolithically integrated half-bridge circuit and includes two power FETs 505 and a signal processing circuit 507. The source of the high-side switch is connected to a high-side output terminal OutH and the drain of the low-side switch is connected to a low-side output terminal OutL. A motor winding may be electrically arranged between the high-side output terminal OutH and the low-side output terminal OutL. The signal processing circuit 507 may provide pulse width modulation, gate driving, overvoltage protection, ESD protection, current limitation, overload protection and/or short-circuit protection, by way of example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method of manufacturing a semiconductor device, the method comprising:
    forming, by thermal oxidation, a field oxide layer lining first and second trenches that extend from a main surface into a semiconductor layer;

forming, after the thermal oxidation, field electrodes and trench gate electrodes of power transistor cells in the first and second trenches;

forming a protection cover comprising a silicon nitride layer and covering a cell area that comprises the first and second trenches;

forming, by local oxidation of silicon and after forming the protection cover, insulator structures between the cell area and the support area and/or between areas assigned to lateral transistors; and forming planar gate electrodes of lateral transistors in a support area of the semiconductor layer with the protection cover covering the cell area.

2. The method of claim 1, further comprising:

implanting, after forming the planar gate electrodes, dopants for contemporaneously forming source zones of the power transistor cells and source/drain zones of the lateral transistors.

3. The method of claim 2, wherein the source zones and the source/drain zones have a same vertical extension with respect to the main surface.

4. The method of claim 1, wherein the local oxidation of silicon uses an oxidation mask comprising a silicon nitride layer, and the insulator structures are formed in openings of the oxidation mask.

5. The method of claim 4, further comprising:

removing the oxidation mask; and removing nitrogen-containing portions by a wet oxidation after providing the protection cover, wherein an auxiliary oxide layer is formed.

6. The method of claim 5, further comprising:

replacing the auxiliary oxide layer by a planar gate dielectric for the lateral transistors.

7. The method of claim 1, further comprising:

forming and recessing, before forming the field oxide layer, a sacrificial oxide lining the first and second trenches.

8. The method of claim 1, further comprising:

implanting, after forming the planar gate electrodes, dopants for forming body zones of the power transistor cells and wells of the second conductivity type in a support area outside the cell area.

9. A method of manufacturing a semiconductor device, the method comprising:

forming, by thermal oxidation, a field oxide layer lining first and second trenches that extend from a main surface into a semiconductor layer;

forming, after the thermal oxidation, field electrodes and trench gate electrodes of power transistor cells in the first and second trenches, wherein forming the field electrodes comprises depositing a conductive first fill material, removing first portions of the first fill material in a polishing process and removing second portions in upper sections of the first trenches by a recess etch, wherein remnant portions of the first fill material form the field electrodes;

removing a first portion of the field oxide layer in the upper sections of the first trenches by using the field electrodes as etch mask;

forming a gate dielectric on portions of the semiconductor layer exposed by removing the first portion of the field oxide layer;

forming a protection cover comprising a silicon nitride layer and covering a cell area that comprises the first and second trenches; and forming planar gate electrodes of lateral transistors in a support area of the semiconductor layer with the protection cover covering the cell area.

10. The method of claim 9, wherein forming the trench gate electrodes comprises depositing a conductive second fill material and removing first portions of the second fill material in a polishing process to form trench gate electrodes in the upper sections of the first trenches.

* * * * *